US008808059B1

(12) United States Patent
David

(10) Patent No.: US 8,808,059 B1
(45) Date of Patent: Aug. 19, 2014

(54) SPECTRAPHIC MONITORING BASED ON PRE-SCREENING OF THEORETICAL LIBRARY

(71) Applicant: Applied Materials Inc., Santa Clara, CA (US)

(72) Inventor: Jeffrey Drue David, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/779,542

(22) Filed: Feb. 27, 2013

(51) Int. Cl.
 B24B 49/00 (2012.01)
 B24B 51/00 (2006.01)
 G06F 19/00 (2011.01)

(52) U.S. Cl.
 USPC .................. 451/5; 451/6; 700/173; 700/174

(58) Field of Classification Search
 CPC ...... B24B 37/013; B24B 49/12; B24B 49/10; B24B 1/00; B24B 49/00
 USPC .................. 451/5–6; 700/173–174
 See application file for complete search history.

(56) References Cited

U.S. PATENT DOCUMENTS

| | | | | | |
|---|---|---|---|---|---|
| 5,486,129 | A | * | 1/1996 | Sandhu et al. | 451/5 |
| 5,498,199 | A | * | 3/1996 | Karlsrud et al. | 451/289 |
| 5,951,373 | A | * | 9/1999 | Shendon et al. | 451/41 |
| 6,046,111 | A | * | 4/2000 | Robinson | 438/693 |
| 6,108,092 | A | * | 8/2000 | Sandhu | 356/630 |
| 6,383,058 | B1 | * | 5/2002 | Birang et al. | 451/41 |
| 6,534,407 | B2 | * | 3/2003 | Chang | 438/692 |
| 6,939,198 | B1 | * | 9/2005 | Swedek et al. | 451/5 |
| 8,616,935 | B2 | * | 12/2013 | Zhang et al. | 451/5 |
| 2009/0275265 | A1 | | 11/2009 | Qian et al. | |
| 2010/0056023 | A1 | * | 3/2010 | David et al. | 451/5 |
| 2010/0120333 | A1 | | 5/2010 | Sin et al. | |
| 2010/0130100 | A1 | * | 5/2010 | David et al. | 451/5 |
| 2011/0300775 | A1 | * | 12/2011 | Zhang et al. | 451/5 |
| 2012/0278028 | A1 | * | 11/2012 | David et al. | 702/127 |

OTHER PUBLICATIONS

Moharam et al., "Formulation for stable and efficient implementation of the rigorous coupled-wave analysis of binary gratings," *J. Opt. Soc. Am. A*, May 1995, 12(5):1068-1076.

Moharam et al., "Stable implementation of the rigorous coupled-wave analysis for surface-relief gratings: enhanced transmittance matrix approach," *J. Opt. Soc. Am. A*, May 1995, 12(5):1077-1086.

Li, "Multilayer modal method for diffraction gratings of arbitrary profile, depth, and permittivity," *J. Opt. Soc. Am. A*, Dec. 1993, 10(12):2581-2591.

* cited by examiner

*Primary Examiner* — Ramesh Patel
(74) *Attorney, Agent, or Firm* — Fish & Richardson P.C.

(57) ABSTRACT

An optical model for a layer stack has a plurality of input parameters, the plurality of input parameters defining a parameter space. A plurality of model spectra are generated by calculating a model spectrum using the optical model for each of a first plurality of different points in the parameter space. A test spectrum of a test substrate is measured. For each model spectrum of the plurality of model spectra, the test spectrum is compared to the model spectrum to determine a difference value, thereby generating a plurality of difference values. A plurality of minima in the plurality of difference values are determined. Reference spectra can be generated clustered around points in the parameter space corresponding to a local minimum from the plurality of minima, or the local minimum can be used as a seed value in fitting the optical model to a measured spectrum.

15 Claims, 6 Drawing Sheets

SPECTRAPHIC MONITORING BASED ON PRE-SCREENING OF THEORETICAL LIBRARY

TECHNICAL FIELD

The present disclosure relates to optical monitoring, e.g., for control of chemical mechanical polishing of substrates.

BACKGROUND

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the conductive layer remaining between the raised pattern of the insulative layer form vias, plugs, and lines that provide conductive paths between thin film circuits on the substrate. For other applications, such as oxide polishing, the filler layer is planarized until a predetermined thickness is left over the non-planar surface. In addition, planarization of the substrate surface is usually required for photolithography.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the substrate to push it against the polishing pad. A polishing liquid, such as a slurry with abrasive particles, is typically supplied to the surface of the polishing pad.

One problem in CMP is determining whether the polishing process is complete, i.e., whether a substrate layer has been planarized to a desired flatness or thickness, or when a desired amount of material has been removed. Variations in the initial thickness of the substrate layer, the slurry composition, the polishing pad condition, the relative speed between the polishing pad and the substrate, and the load on the substrate can cause variations in the material removal rate. These variations cause variations in the time needed to reach the polishing endpoint. Therefore, it may not be possible to determine the polishing endpoint merely as a function of polishing time.

In some systems, a substrate is optically monitored in-situ during polishing, e.g., through a window in the polishing pad. However, existing optical monitoring techniques may not satisfy increasing demands of semiconductor device manufacturers.

SUMMARY

In some optical monitoring processes, a measured spectrum is compared to a library of reference spectra to find the best matching reference spectrum. One technique to build a library of reference spectra is to calculate a reference spectrum based on an optical model of the thin film stack on the substrate. The size of the library of reference spectra grows rapidly as the number of layers, the number of variable parameters for each layer, or the number of increments each variable spans increase. The larger the library, the more memory needed to hold the library and the higher the processing load to search the library. A larger library may also produce multiple possible matches, causing lower reliability or requiring other techniques to sift the possible matches and select an acceptable match.

Another optical monitoring technique is to fit a function, e.g., the optical model, to the measured spectra. However, a complex optical model with a large the number of variable input parameters can suffer similar problems of computational load and possible false fitting of the optical parameters.

The region of a parameter space that should be searched, or the likely seed values to use when fitting the optical model, can be limited by identifying local minima in the parameter space. The local minima can be found by generating model spectra from the optical model across a wide range for each input parameter, and comparing the model spectra to a spectrum from a test substrate.

In one aspect, a method of controlling a polishing operation includes storing an optical model for a layer stack having a plurality of layers. The optical model has a plurality of input parameters, the plurality of input parameters defining a parameter space. A plurality of model spectra are generated by calculating a model spectrum using the optical model for each of a first plurality of different points in the parameter space. A test spectrum of a test substrate is measured. For each model spectrum of the plurality of model spectra, the test spectrum is compared to the model spectrum to determine a difference value, thereby generating a plurality of difference values. A plurality of minima in the plurality of difference values are determined. For at least one local minimum of the plurality of minima, a plurality of reference spectra is determined. The plurality of reference spectra for each local minimum are generated using the optical model with a second plurality of different points in the parameter space clustered at a point in the parameter space corresponding to the local minimum. A spectrum of a substrate is measured with an in-sequence or in-situ monitoring system to provide a measured spectrum. A best matching reference spectrum from the plurality of reference spectra that provides a best match to the measured spectrum is determined. The first value associated with the best matching reference spectrum is determined. The substrate is polished with the polishing apparatus. A polishing endpoint or a polishing parameter of the polishing apparatus is adjusted based on the first value associated with the best matching reference spectrum.

Implementations may include one or more of the following features. Data defining a first plurality of first values for a first parameter of the plurality of input parameters and a second plurality of second values for a second parameter of the plurality of input parameters may be stored. Generating the plurality of model spectra may includes calculating the model spectrum for each combination of a first value of first plurality and a second value of the second plurality. The data may include, for each parameter of the plurality of parameters, a range and an increment or a number of increments. Determining the plurality of minima may include dividing the parameter space into a plurality of sections and determining a minimum for each section. The first plurality of different points may be distributed in the parameter space at a uniform first spacing and the plurality of sections may cover the parameter space at a uniform second spacing greater than the first spacing. The second plurality of different points may be uniformly distributed in the parameter space at the first spacing. The second plurality of different points may be a subset of the first plurality of different points. The second plurality of different points may be distributed in the parameter space at spacing different from the first spacing. The second plurality of different points may be centered around the point in the parameter space corresponding to the local minimum. Data defining a third plurality of third values for a first parameter of the plurality of input parameters and a fourth plurality of fourth values for a second parameter of the plurality of input parameters may be stored. Generating the plurality of reference spectra may include calculating the reference spectrum for each combination of a third value of third plurality and a fourth value of the fourth plurality. The data may include, for each parameter of the plurality of parameters, a range and an increment. Comparing the test spectrum to the model spectrum may include calculating a sum of squares difference, a sum of absolute differences, or a cross-correlation between the test spectrum and the model spectrum.

In another aspect, a method of controlling a polishing operation includes storing an optical model for a layer stack having a plurality of layers. The optical model has a plurality of input parameters, the plurality of input parameters defining a parameter space. A plurality of model spectra are generated by calculating a model spectrum using the optical model for each of a first plurality of different points in the parameter space. A test spectrum of a test substrate is measured. For each model spectrum of the plurality of model spectra, the test spectrum is compared to the model spectrum to determine a difference value, thereby generating a plurality of difference values. A plurality of minima in the plurality of difference values is determined. A spectrum of a substrate is measured with an in-sequence or in-situ monitoring system to provide a measured spectrum. The optical model is fit to the measured spectrum. The fitting including finding a first value of a first parameter of the plurality of input parameters that provides a minimum difference between an output spectrum of the optical model and the measured spectrum, the fitting including using a point in the parameter space corresponding to a local minimum from the plurality of minima as a seed value in searching for the minimum difference. The substrate is polished with the polishing apparatus. A polishing endpoint or a polishing parameter of the polishing apparatus is adjusted based on the first value.

Certain implementations can include one or more of the following advantages. The region of a parameter space that should be searched, either by fitting of an optical model or by searching a library of reference spectra, can be reduced, thus reducing computational load and decreasing the likelihood of false fits or matches. The parameter space to be searched can still span the likely range of variations of incoming substrate, enabling the algorithm to remain reliable when there is variation in underlying parameters. Thus, reliability of an endpoint system to detect a desired polishing endpoint may be improved, and within-wafer and wafer-to-wafer thickness non-uniformity (WIWNU and WTWNU) may be reduced.

BRIEF DESCRIPTION OF THE DRAWINGS

Like reference numbers and designations in the various drawings indicate like elements.

DETAILED DESCRIPTION

Figure 1:
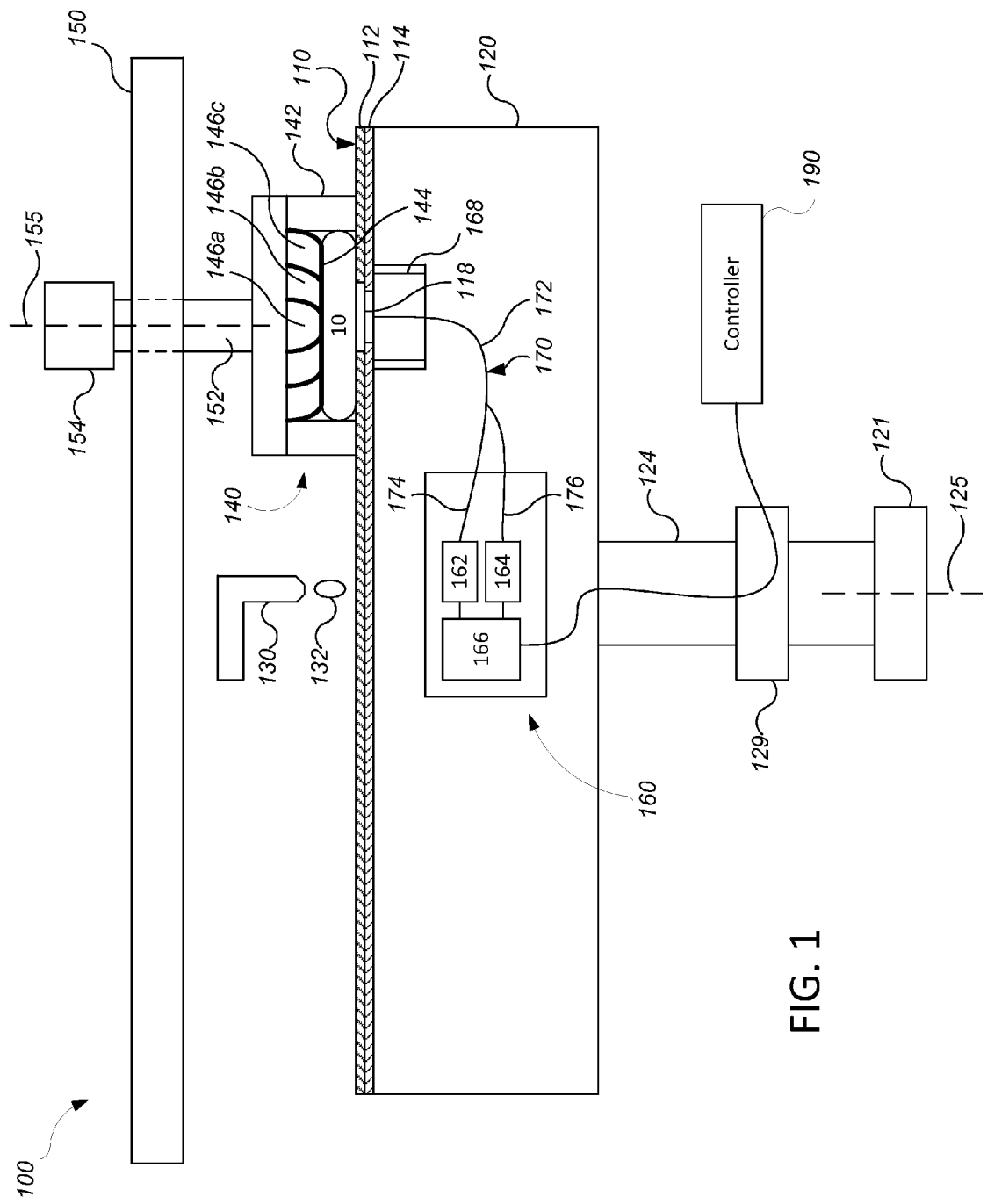
FIG. 1 illustrates a schematic cross-sectional view of an example of a polishing apparatus.

One optical monitoring technique for controlling a polishing operation is to measure a spectrum of light reflected from a substrate, either in-situ during polishing or at an in-line metrology station, and compare the measured spectrum to a plurality of reference spectra from a library, and identify a best-matching reference spectrum. The reference spectra can be calculated from an optical model by varying multiple input parameters. Ideally, the optical model has sufficient degrees of freedom to generate a library of reference spectra that spans the likely range of variation of incoming substrates.

One potential problem is the size of the library of reference spectra. For reliable polishing of some types of substrates, the library of reference spectra may have reference spectra that span the likely range of variations in thickness and/or other parameters of the underlying layers of incoming substrates, and consequently increasing the size of the library. In some examples, for a reliable match, the numbers of increments of the variable parameters increase and consequently the size of the library of reference spectra further increases. The increase in library size may hamper a reliable real-time match if all library members are considered.

Another optical monitoring technique is to fit a function, e.g., an optical model, to the measured spectra. If the optical model is complex and has a large number of parameters to optimize, the function fitting technique can have a related problem; computational load and the possibility of false matches.

It may be possible to reduce the size of the library or simplify the fitting of the optical model to the measured spectrum with a two step process. In the first step, while spanning the parameter space, a plurality of model spectra are compared to a test spectrum from a test substrate, and local minima in the parameter space are found. In the second step, a spectrum is measured from the product substrate. For the library searching technique, a library of reference spectra is searched around the local minima of the first step and a best match to the measured spectrum is found. Thus, only a subset of the library is calculated and searched. For the function fitting technique, the local minima are used as seed values for fitting the optical model to the measured spectrum.

Some substrates include regions with different stacks of layers. Examples of materials for layers from the stack include silicon oxide, carbon-doped silicon oxide, silicon carbide, silicon nitride, carbon-doped silicon nitride, polysilicon, and metal, e.g., copper. As a very simple example, some regions can include a single dielectric layer over a metal layer, and other regions can include two dielectric layers over a metal layer. Of course, much more complex layer stacks are likely in a real-world application. For example, when polishing a substrate in a back-end-of-line process, some regions of the substrate can include exposed metal, other regions can include a single layer set, and yet other regions can include multiple vertically arranged layer sets. Each layer set can correspond to a metal layer in the metal interconnect structure of the substrate. For example, each layer set includes a dielectric layer, e.g., a low-k dielectric, and an etch-stop layer, e.g., silicon carbide, silicon nitride, or carbon-silicon nitride (SiCN).

FIG. 1 illustrates an example of a polishing apparatus 100. The polishing apparatus 100 includes a rotatable disk-shaped platen 120 on which a polishing pad 110 is situated. The platen is operable to rotate about an axis 125. For example, a motor 121 can turn a drive shaft 124 to rotate the platen 120. The polishing pad 110 can be a two-layer polishing pad with an outer polishing layer 112 and a softer backing layer 114.

The polishing apparatus 100 can include a port 130 to dispense polishing liquid 132, such as a slurry, onto the polishing pad 110 to the pad. The polishing apparatus can also include a polishing pad conditioner to abrade the polishing pad 110 to maintain the polishing pad 110 in a consistent abrasive state.

The polishing apparatus 100 includes one or more carrier heads 140. Each carrier head 140 is operable to hold a substrate 10 against the polishing pad 110. Each carrier head 140 can have independent control of the polishing parameters, for example pressure, associated with each respective substrate.

Figure 3:
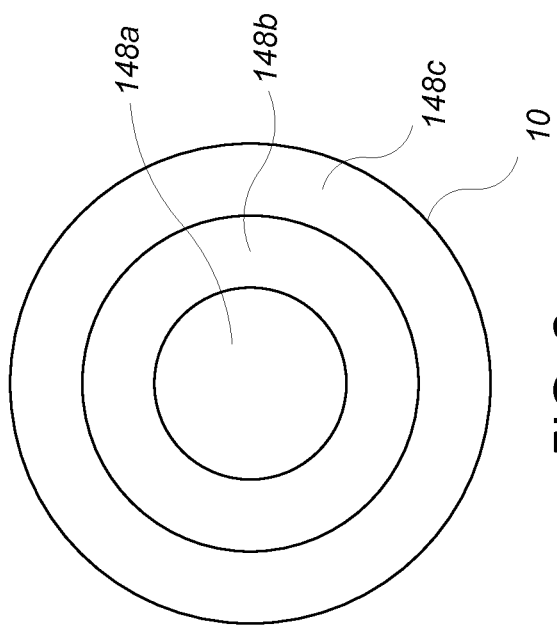
FIG. 3 illustrates a schematic top view of a substrate having multiple zones.

In particular, each carrier head 140 can include a retaining ring 142 to retain the substrate 10 below a flexible membrane 144. Each carrier head 140 also includes a plurality of independently controllable pressurizable chambers defined by the membrane, e.g., three chambers 146a-146c, which can apply independently controllable pressurizes to associated zones 148a-148c on the flexible membrane 144 and thus on the substrate 10 (see FIG. 3). Referring to FIG. 3, the center zone 148a can be substantially circular, and the remaining zones 148b-148c can be concentric annular zones around the center zone 148a. Although only three chambers are illustrated in FIGS. 1 and 3 for ease of illustration, there could be one or two chambers, or four or more chambers, e.g., five chambers.

Returning to FIG. 1, each carrier head 140 is suspended from a support structure 150, e.g., a carousel or track, and is connected by a drive shaft 152 to a carrier head rotation motor 154 so that the carrier head can rotate about an axis 155. Optionally each carrier head 140 can oscillate laterally, e.g., on sliders on the carousel 150; by rotational oscillation of the carousel itself, or by motion of a carriage 108 (see FIG. 2) that supports the carrier head 140 along the track. In operation, the platen is rotated about its central axis 125, and each carrier head is rotated about its central axis 155 and translated laterally across the top surface of the polishing pad.

In some implementations, the polishing apparatus includes an in-situ optical monitoring system 160, e.g., a spectrographic monitoring system, which can be used to measure a spectrum of reflected light from a substrate undergoing polishing. An optical access through the polishing pad is provided by including an aperture (i.e., a hole that runs through the pad) or a solid window 118.

If the window 118 is installed in the platen, due to the rotation of the platen (shown by arrow 204), as the window 108 travels below a carrier head, the optical monitoring system making spectra measurements at a sampling frequency will cause the spectra measurements to be taken at locations 201 in an arc that traverses the substrate 10.

Figure 2:
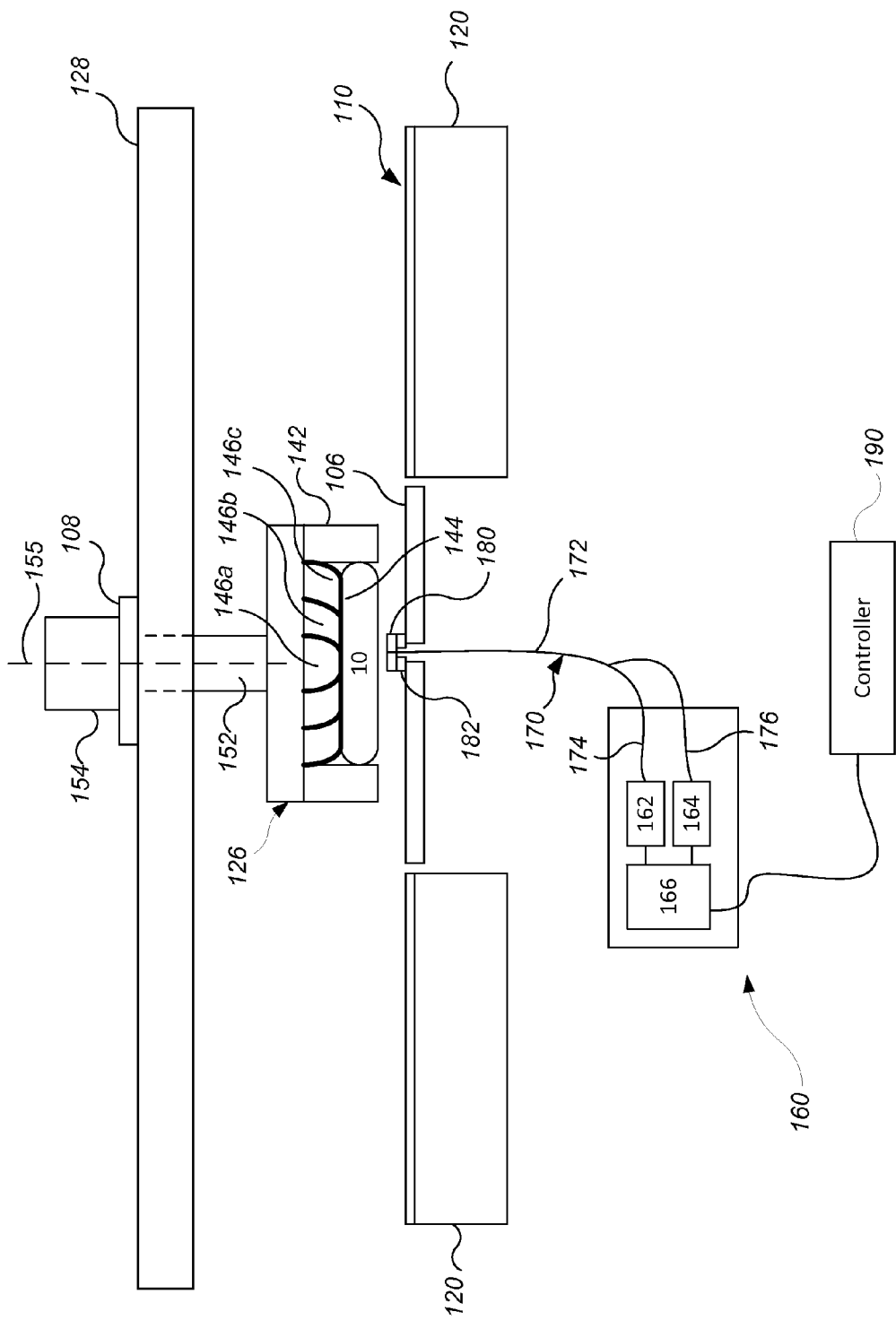
FIG. 2 illustrates a schematic cross-sectional view of an example of an in-sequence optical metrology station.

In some implementation, illustrated in FIG. 2, the polishing apparatus includes an in-sequence optical monitoring system 160 having a probe 180 positioned between two polishing stations or between a polishing station and a transfer station. The probe 180 of the in-sequence monitoring system 160 can be supported on a platform 106, and can be positioned on the path of the carrier head.

The probe 180 can include a mechanism to adjust its vertical height relative to the top surface of the platform 106. In some implementations, the probe 180 is supported on an actuator system 182 that is configured to move the probe 180 laterally in a plane parallel to the plane of the track 128. The actuator system 182 can be an XY actuator system that includes two independent linear actuators to move probe 180 independently along two orthogonal axes. In some implementations, there is no actuator system 182, and the probe 180 remains stationary (relative to the platform 106) while the carrier head 126 moves to cause the spot measured by the probe 180 to traverse a path on the substrate.

Referring to FIGS. 1 and 2, in either of the in-situ or in-sequence implementations, the optical monitoring system 160 can include a light source 162, a light detector 164, and circuitry 166 for sending and receiving signals between a remote controller 190, e.g., a computer, and the light source 162 and light detector 164. One or more optical fibers can be used to transmit the light from the light source 162 to the optical access in the polishing pad, and to transmit light reflected from the substrate 10 to the detector 164. For example, a bifurcated optical fiber 170 can be used to transmit the light from the light source 162 to the substrate 10 and back to the detector 164. The bifurcated optical fiber an include a trunk 172 positioned in proximity to the optical access, and two branches 174 and 176 connected to the light source 162 and detector 164, respectively. The probe 180 can include the trunk end of the bifurcated optical fiber.

The light source 162 can be operable to emit white light. In one implementation, the white light emitted includes light having wavelengths of 200-800 nanometers. In some implementations, the light source 162 generates unpolarized light. In some implementations, a polarization filter 178 (illustrated in FIG. 2, although it can be used in the monitoring system of FIG. 1) can be positioned between the light source 162 and the substrate 10. A suitable light source is a xenon lamp or a xenon mercury lamp.

Figure 4:
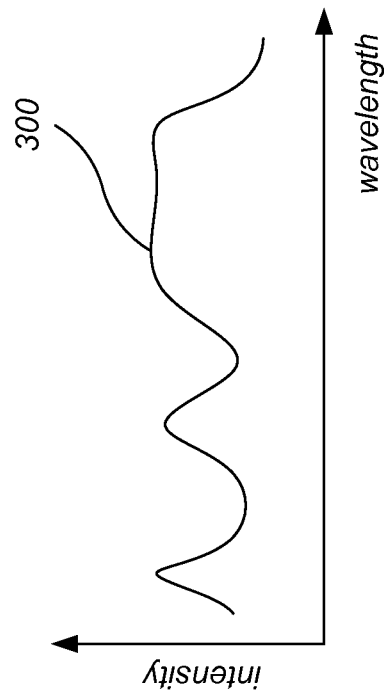
FIG. 4 illustrates a measured spectrum from the in-situ optical monitoring system.

The light detector 164 can be a spectrometer. A spectrometer is an optical instrument for measuring intensity of light over a portion of the electromagnetic spectrum. A suitable spectrometer is a grating spectrometer. Typical output for a spectrometer is the intensity of the light as a function of wavelength (or frequency). FIG. 4 illustrates an example of a measured spectrum 300.

As noted above, the light source 162 and light detector 164 can be connected to a computing device, e.g., the controller 190, operable to control their operation and receive their signals. The computing device can include a microprocessor situated near the polishing apparatus, e.g., a programmable computer. In operation, the controller 190 can receive, for example, a signal that carries information describing a spectrum of the light received by the light detector for a particular flash of the light source or time frame of the detector.

Optionally, the in-sequence metrology system 160 can be a wet metrology system. In a wet-metrology system, measurement of the surface of the substrate is conducted while a layer of liquid covers the portion of the surface being measured. An advantage of wet metrology is that the liquid can have a similar index of refraction as the optical fiber 270. The liquid can provide a homogeneous medium through which light can travel to and from the surface of the film that is to be or that has been polished. The wet metrology system can be configured such that the liquid is flowing during the measurement. A flowing liquid can flush away polishing residue, e.g., slurry, from the surface of the substrate being measured.

In some implementations, the controller 190, e.g., the computing device, can be programmed to compare a measured spectrum to multiple reference spectra and to determine which reference spectrum provides the best match.

In some implementations, controller software can be used to automatically calculate multiple reference spectra. Since there are variations in the thicknesses of the underlying layers of the incoming substrates, the manufacturer can input a thickness range and a thickness increment or a number of increments for at least one of the underlying layers, e.g., for multiple underlying layers. The software will calculate a reference spectra for each combination of thicknesses of the underlying layers. Multiple reference spectra can be calculated for each thickness of the overlying layer.

To calculate the reference spectra, the following optical model can be used. The reflectance $R_{STACK}$ of the top layer p of a thin film stack can be calculated as $$R_{STACK} = \left|\frac{E_p^-}{E_p^+}\right|^2$$

where Ep+ represents the electro-magnetic field strength of the incoming light beam and Ep− represents the electromagnetic field strength of the outgoing light beam.

The values $E_p^+$ and $E_p^-$ can be calculated as $$E_p^+ = (E_p + H_p/\mu_p)/2 \quad E_p^- = (E_p - H_p/\mu_p)/2$$

The fields E and H in an arbitrary layer j can be calculated using transfer-matrix methods from the fields E and H in an underlying layer. Thus, in a stack of layers 0, 1, ..., p−1, p (where layer 0 is the bottom layer and layer p is the outermost layer), for a given layer j>0, $E_j$ and $H_j$ can be calculated as $$\begin{bmatrix} E_j \\ H_j \end{bmatrix} = \begin{bmatrix} \cos g_j & \frac{i}{u_j}\sin g_j \\ i\mu_j \sin g_j & \cos g_j \end{bmatrix} \begin{bmatrix} E_{j-1} \\ H_{j-1} \end{bmatrix}$$

with $\mu_j = (n_j - ik_j)\cdot\cos\phi_j$ and $g_j = 2\pi(n_j - ik_j)\cdot t_j \cdot \cos\phi_j/\lambda$, where $n_j$ is the index of refraction of layer j, $k_j$ is an extinction coefficient of layer j, $t_j$ is the thickness of layer j, $\phi_j$ is the incidence angle of the light to layer j, and $\lambda$ is the wavelength. For the bottom layer in the stack, i.e., layer j=0, $E_0=1$ and $H_0=\mu_0=(n_0-ik_0)\cdot\cos\phi_0$. The index of refraction n and the extinction coefficient k for each layer can be determined from scientific literature, and can be functions of wavelength. The incidence angle $\phi$ can be calculated from Snell's law.

The thickness t for a layer can be calculated from the thickness range and thickness increment input by the user for the layer, e.g., tj=TMINj+k*TINCj for k=0, 1, ..., for tj≤TMAXj, where TMINj and TMAXj are the lower and upper boundaries of the range of thicknesses for layer j and TINCj is the thickness increment for layer j. The calculation can be iterated for each combination of thickness values of the layers.

A potential advantage of this technique is quick generation of a large number of reference spectra that can correspond to different combinations of thicknesses of layers on the substrate, thus improving likelihood of finding a good matching reference spectra and improving accuracy and reliability of the optical monitoring system.

As an example, the light intensity reflected from the substrate can be calculated as $$\begin{bmatrix} E_5 \\ H_5 \end{bmatrix} = \begin{bmatrix} \cos g_4 & \frac{i}{u_j}\sin g_4 \\ i\mu_4 \sin g_4 & \cos g_4 \end{bmatrix} \begin{bmatrix} \cos g_3 & \frac{i}{u_j}\sin g_3 \\ i\mu_3 \sin g_3 & \cos g_3 \end{bmatrix}$$

-continued $$\begin{bmatrix} \cos g_2 & \frac{i}{u_2}\sin g_2 \\ i\mu_2 \sin g_2 & \cos g_2 \end{bmatrix} \begin{bmatrix} \cos g_1 & \frac{i}{u_1}\sin g_1 \\ i\mu_1 \sin g_1 & \cos g_1 \end{bmatrix} \begin{bmatrix} 1 \\ \mu_0 \end{bmatrix}$$

with values of $g_4$ and $\mu_4$ depending on the thickness, index of refraction and extinction coefficient of the outermost layer of the substrate, e.g., an upper dielectric layer, e.g., a low-k material, $g_3$ and $\mu_3$ depending on the thickness, index of refraction and extinction coefficient of an underlying layer, e.g., an etch stop layer, e.g., SiCN, $g_2$ and $\mu_2$ depending on the thickness, index of refraction and extinction coefficient of another underlying layer, e.g., a lower dielectric layer, $g_1$ and $\mu_1$ depending on the thickness, index of refraction and extinction coefficient of another underlying layer, e.g., a passivation layer, e.g., SIN, and $\mu_0$ depending on the index of refraction and extinction coefficient of the bottom layer, e.g., a conductive layer, e.g., copper.

The reflectance $R_{STACK}$ can then be calculated as $$R_{STACK} = \frac{E_5 - \frac{H_5}{\mu_5}}{E_5 + \frac{H_5}{\mu_5}}$$

Although not shown, the presence of a layer of water over the substrate (to represent the polishing liquid through which the light will be arriving) can also be accounted for in the optical model, e.g., during in-situ monitoring.

The substrate and associated optical stack described above is only one possible assembly of layers, and many others are possible. For example, the optical stack described above uses a conductive layer at the bottom of the optical stack, which would be typical for a substrate in a back-end-of-line process. However, in a front-end-of-line process, or if the conductive layer is a transparent material, then the bottom of the optical stack can be the semiconductor wafer, e.g., silicon. As another example, some substrates may not include the lower dielectric layer.

In some situations, some spectral measurements may be made from substrates with a layer having a higher index of refraction or extinction coefficient, whereas other spectral calculations may be made from substrates with a layer having a lower index of refraction or extinction coefficient. Therefore, in addition to variations of the layer thicknesses, the above described optical model can include variations in the index of refraction n and/or the extinction coefficient k of one or more layers in the optical stack. The one or more layers can include the underlying layer and/or the overlying layer.

The calculation of spectrum $R_{LIBRARY}$ can be iterated over multiple values for n and/or k. For example, index of refraction can be modeled by a Cauchy equation, and the dispersion coefficients could be varied to vary the index of refraction. For example, the user might vary the index of refraction parameter A of the Caucy equation between 1.40 and 1.45 at 0.01 increments. The extinction coefficient can be modeled by the equation k=A+exp(B−12400*(1/lambda−1/C)) with lambda in Angstroms. A can range from 0.003 to 0.006 with increment 0.001, and B can vary from 0.45 to 0.55 with increment 0.01. The controller software may receive user input identifying a first number of different contribution percentages for the first stack, and a plurality of different contribution percentages for the second stack can be calculated from the first number of different contribution percentages.

In some implementations, controller software can be used to receive user input to identify a set of one or more refractive index functions and/or a set of one or more extinction coefficient functions. A refractive index function can provide a refractive index for a material of a layer as a function of wavelength. Similarly, an extinction coefficient function can provide an extinction coefficient for a material of a layer as a function of wavelength. Where there are variations between substrates in the refractive index, a plurality of different refractive index functions can be used to generate the reference spectra. Similarly, where there are variations between substrates in the extinction coefficient, a plurality of extinction coefficient functions can be used to generate the reference spectra. For example, the controller software can calculate a reference spectrum for each combination of a refractive index function from the set of refractive index functions and an extinction coefficient function from the set of extinction coefficient functions.

The different refractive index functions can be variants of a common generic refractive index function. For example, the generic refractive index function can be a function of wavelength and one or more additional coefficients, and the different refractive index functions can constitute different values for the coefficient(s). The values of the coefficient(s) can be set by a user, e.g., the semiconductor manufacturer. For example, for a particular coefficient, a user can set the values by inputting a lower value, an upper value and an incremental value or a number of total increments. In another example a user can define an index range and an extinction coefficient range. The user can also define an index increment and an extinction coefficient increment or alternatively can define a number of increments for each one of index and extinction coefficient ranges.

In addition to variations of the layer thicknesses and the layer indices of refraction and/or the extinction coefficients, the optical model can include variations in the spectral contribution of the metal layer. That is, depending on the pattern on the die being manufactured, some spectral measurements may be made in regions with high concentration of metal (e.g., from metal material in the trenches), whereas other spectral measurements may be made in regions with lower concentration of metal.

During monitoring process, the placement of the light beam on the substrate is not precisely controlled. Consequently the light beam will sometimes land primary on a region with one layer stack, and sometimes the light beam will land primarily on a region with a different layer stack. In short, the percentage contribution to the spectrum from each different layer stack on the substrate can vary from measurement to measurement. However, it is possible to generate multiple reference spectra that span the likely range of variation in contribution by the different layer stacks.

In some implementations, the optical model can include variations in the spectral contribution of the different layer stacks. That is, depending on the pattern on the die being manufactured, some spectral measurements may be made in regions with high percentage (by area) of a first layer stack, whereas other spectral measurements may be made in regions with lower concentration of the first layer stack.

The spectrum $R_{LIBRARY}$ that is added to the library can be a combination of multiple stack models. For example, there could be a first layer stack, $R_{STACK1}$ which is the spectral contribution of the topmost layer set, and a second layer stack $R_{STACK2}$ which is the spectral contribution of the two topmost layer sets. For example, the first layer set can include a capping layer, a dielectric layer, and a barrier layer (and copper as the bottom of the stack). The second layer set can include the capping layer, dielectric layer and barrier layer from the first stack, plus the dielectric layer and barrier layer that would reside beneath the first stack (and again, copper as the bottom of the stack).

The spectrum $R_{LIBRARY}$ that is added to the library can be calculated as $$R_{LIBRARY} = \frac{1}{R_{REFERENCE}}[X * R_{STACK1} + (1-X) * R_{STACK2}]$$

where $R_{STACK1}$ is the first spectrum, $R_{STACK2}$ is the second spectrum, $R_{REFERENCE}$ is a spectrum of a bottom layer of the first stack and the second stack, and X is the percentage contribution for the first stack. The calculation of spectrum $R_{LIBRARY}$ can be iterated over multiple values for X. For example, X can vary between 0.0 and 1.0 at 0.1 intervals. The controller software may receive user input identifying a first number of different contribution percentages for the first stack, and a plurality of different contribution percentages for the second stack can be calculated from the first number of different contribution percentages.

A potential advantage of this technique is generation of reference spectra that can correspond to different percentage contributions by different layer stacks in the measured spot on the substrate, thus improving likelihood of finding a good matching reference spectra and improving accuracy and reliability of the optical monitoring system.

In addition to variations of the layer thicknesses, the optical model can include variations in the spectral contribution of the metal layer. That is, depending on the pattern on the die being manufactured, some spectral measurements may be made in regions with high concentration of metal (e.g., from metal material in the trenches), whereas other spectral measurements may be made in regions with lower concentration of metal. As a layer of material is defined by refractive index, the extinction coefficient and thickness, for a given material there is a function for each one of refractive index and extinction coefficient that characterize its optical properties. The functions can either be measured, empirically determined, or modeled.

So the calculation for $R_{LIBRARY}$ could look something like:

$$R_{LIBRARY} = \frac{1}{R_{REFERENCE}}[Y * R_{METAL} + X * R_{STACK1} + (1-X-Y) * R_{STACK2}]$$

where X+Y<1, $R_{STACK1}$ is the first spectrum, $R_{STACK2}$ is the second spectrum, $R_{METAL}$ is the third spectrum, $R_{REFERENCE}$ is a spectrum of a bottom layer of the stack, and X is the percentage contribution for the first stack, and Y is the percentage contribution for the metal. In some implementations, e.g., if the metal layers of adjacent regions are the same material, e.g., copper, then $R_{REFERENCE}$ and $R_{METAL}$ are the same spectrum, e.g., the spectrum for copper.

In some implementations, calculation of the second spectrum can ignore layers below the second layer set, and/or artificially increase the extinction coefficient of some of the layers to represent the reduced likelihood of light reaching those layers.

In some implementations, calculation of the first spectrum can include calculating a stack reference $R_{STACK1}$ $$R_{STACK1} = \frac{E_P - \frac{H_P}{\mu_P}}{E_P + \frac{H_P}{\mu_P}}$$

where for each layer j>0, $E_j$ and $H_j$ are calculated as $$\begin{bmatrix} E_j \\ H_j \end{bmatrix} = \begin{bmatrix} \cos g_j & \frac{i}{u_j}\sin g_j \\ i\mu_j \sin g_j & \cos g_j \end{bmatrix} \begin{bmatrix} E_{j-1} \\ H_{j-1} \end{bmatrix}$$

where $E_0$ is 1 and $H_0$ is $\mu_0$, and where for each layer j≥0, $\mu_j=(n_j-ik_j)\cdot\cos\phi_j$ and $g_j=2\pi(n_j-ik_j)\cdot t\cdot\cos\phi_j/\lambda$, where $n_j$ is the index of refraction of layer j, $k_j$ is an extinction coefficient of layer j, $t_j$ is the thickness of layer j, $\phi_j$ is the incidence angle of the light to layer j, and $\lambda$ is the wavelength.

Similarly, the second spectrum can be calculated including a stack reflectance $R_{STACK2}$ $$R_{STACK2} = \frac{E_P - \frac{H_P}{\mu_P}}{E_P + \frac{H_P}{\mu_P}}$$

where for each layer j>0, $E_j$ and $H_j$ are calculated as $$\begin{bmatrix} E_j \\ H_j \end{bmatrix} = \begin{bmatrix} \cos g_j & \frac{i}{u_j}\sin g_j \\ i\mu_j \sin g_j & \cos g_j \end{bmatrix} \begin{bmatrix} E_{j-1} \\ H_{j-1} \end{bmatrix}$$

where $E_0$ is 1 and $H_0$ is $\mu_0$, and where for each layer j≥0, $\mu=(n_j-i(k_j+m_j))\cdot\cos\phi_j$ and $g_j=2\pi(n_j-i(k_j+m_j))\cdot t_j\cdot\cos\phi_j/\lambda$, where $n_j$ is an index of refraction of layer j, $k_j$ is an extinction coefficient of layer j, $m_j$ is the amount to increase the extinction coefficient of layer j, $t_j$ is the thickness of layer j, $\phi_j$ is the incidence angle of the light to layer j, and $\lambda$ is the wavelength.

The calculation of spectrum $R_{LIBRARY}$ can be iterated over multiple values for X and Y. For example, X can vary between 0.0 and 1.0 at 0.1 intervals and Y can vary between 0.0 and 1.0 at 0.1 intervals. A potential advantage of this technique is generation of reference spectra that can correspond to different concentrations of metal in the measured spot on the substrate, thus improving likelihood of finding a good matching reference spectra and improving accuracy and reliability of the optical monitoring system.

In some implementations, the optical model can at least partially accounts for diffraction effects generated by a repeating feature on the substrate. In this case, at least one of the input parameters represents a characteristic of the repeating feature. The diffraction effects can be calculated using rigorous coupled waveform analysis. In particular, rigorous coupled waveform analysis (RCWA) can be used to model and calculate the diffraction effects. RCWA equations can be used to generate a reflectance R for each wavelength, and then to determine a diffraction efficiency at each wavelength.

Details of RCWA are laid out "Formulation for stable and efficient implementation of the rigorous coupled-wave analysis of binary gratings" by Moharam et. al, and "Stable implementation of the rigorous coupled-wave analysis for surface-relief gratings: enhanced transmittance matrix approach" by Moharam et. al., each of which is incorporated by reference. For example, for optically modeling of a "1-D" diffraction grating, equations 24-26 from "Stable implementation of the rigorous coupled-wave analysis for surface-relief gratings: enhanced transmittance matrix approach" can be used to generate R for each wavelength, and the diffraction efficiency can be determined at each wavelength via equations 25 and 45 from "Formulation for stable and efficient implementation of the rigorous coupled-wave analysis of binary gratings." There are alternative techniques, e.g., described in "Multilayer modal method for diffraction gratings of arbitrary profile, depth, and permittivity" by Lifeng Li. But in these various techniques, the model includes diffraction caused by the repeating structure.

The controller software may receive user input identifying a plurality of different metal contribution percentages for the metal layer, which may include receiving user input identifying a first number of different contribution percentages for the first stack and receiving user input identifying a second number of different contribution percentages for the second stack. The plurality of different metal contribution percentages can be calculated from the first number of different contribution percentages and the second number of different contribution percentages.

Certain parameters can vary, e.g., due to process variations. As an example, process variations can happen with a substrate, among substrates of a single cassette, or from lot to lot. As noted above, for any parameters that are expected to vary, a fab facility or the manufacture of the equipment can set some ranges that also include incremental values or number of increments. Based on an optical model and by spanning the ranges of the parameters that can vary, the controller software generates a number of reference spectra. The generated reference spectra define the expected spectra for the substrate being polished. The in-situ or in-sequence optical monitoring system of a polishing apparatus can measure a spectrum of the substrate and find a best matching reference spectrum for the measured spectrum.

A problem is that as the number of input parameters that can vary grows, and as the number of increments for each parameter increases, the number of reference spectra in the library increases rapidly. For example, with six input parameters (e.g., thickness, index of refraction and extinction coefficient for each of two layers) and just ten possible values per input parameter, the library can reach one million reference spectra, which may be impractical for searching. Moreover, in some examples, the monitoring system samples an area of a substrate that covers more than one stack of layers causing the spectral contribution of different stack layers. A number of different reference spectra are calculated by combining the spectra of the different stack layers with all possible coverage percentages, further increasing the size of the reference spectra. Generating the reference spectra in memory and finding a reliable real-time match can strain the memory and/or the processing power if the size of the reference spectra is large. Additionally, if the parameter space is too large, then it is likely the wrong local minimum is identified. Even if a local minimum is actually the global minimum, it may not be the optimal solution. Furthermore, in the case of some regression techniques, the algorithm may converge on the wrong local minimum if the seed value is not properly identified.

The size of the library needed for the optical monitoring system is reduced if only a subset of the library is calculated and searched when measuring a product substrate. The identification of a spectrum from a library of reference spectra that best matches a measured spectrum is performed in two steps, which can occur prior to monitoring a product substrate with the in-situ or in-line monitoring system. In the first step, local minima are identified in a plurality of model spectra. In the second step, reference spectra are generated around the local minima, or the local minima can be used as seed values for a regression approach.

A controller (e.g., controller 190) calculates a plurality of model spectra from the optical model by allowing the input parameters to span a first volume of the parameter space. In some implementations, each input parameter is stepped regularly across an associated range for that input parameter. That is, for a particular input parameter, the values input to the optical model are spread uniformly across the associated range. For example, a particular input parameter, e.g., underlying layer thickness, could vary between 2700 Å and 2900 Å at increments of 10 Å.

In addition, a test spectrum is obtained from a test substrate. The test spectrum can be measured using the optical monitoring system 160. The test substrate can be a substrate with the same pattern as the product substrate, but used during a qualification procedure. Alternatively, the test substrate could be obtained from measurement of one of the substrates from a cassette of product substrate at a stand-alone metrology station.

The controller compares the measured spectrum to each reference spectrum from the plurality of reference spectra, and calculates a difference value between each calculated reference spectrum and the measured spectrum. The difference value can be calculated using a sum of squares difference, a sum of absolute differences, or a cross-correlation between the test spectrum and the model spectrum. Since each difference value is generated by a different combination of values for the input parameters, each difference value is thus associated with a different particular point in the parameter space. The collection of difference values across the parameter space can be considered a difference value map.

The controller then identifies the positions in the parameter space of one or more local minima in the difference value map. For example, the parameter space can be divided into blocks, and the minima of the difference values inside each block. For at least one of the input parameters, e.g., for all input parameters, the blocks are larger than the increments separating the values used to generate the model spectra. For example, for a particular input value, a block can be 2 to 10 times larger, e.g., 5 times larger than the increment for that input value. For example, if the particular input parameter is the underlying layer thickness, and the increment is 10 Å, then each block can be 50 Å.

The controller selects one or more of the minima as local minima. Some minima can be rejected. As an example, if a minimum is on the boundary of a block (and it is not on the boundary of the entire parameter space), this indicates that a local minimum not present in that block, so the minimum is not selected as a local minimum.

In the second step, the controller calculates the reference spectra from the optical model. The reference spectra are generated in a cluster in the parameter space around the selected minima. The reference spectra can be generated from the optical model by allowing the input parameters to span at least one second volume of the parameter space. The second volume is smaller than the first volume, and includes the local minima. In some implementations, the second volume is equivalent to the block containing the local minima. In some implementations, the second volume is centered on the local minima.

In some implementations, to generate the reference spectra, each input parameter is stepped regularly across an associated range, with the associated range being smaller than the associated range used for generation of the model spectra. For example, if a the particular input parameter is underlying layer thickness, and the parameter varies between 2700 Å and 2900 Å for generation of model spectra, and the local minimum is located at 2730 Å, the parameter can vary between 2700 Å and 2750 Å for generation of the reference spectra.

The reference spectra can be generated by using values for the input parameters that are spread uniformly across the associated range. The reference spectra can be generated using an incremental size that is the same size, or smaller than the increment used to generate the model spectra. For example, if the particular input parameter is the underlying layer thickness, and the increment used to generate the model spectra is 10 Å, then an increment of 10 Å can also be used to generate the model spectra.

In some implementations, the model spectra are stored, e.g., on a hard drive or similar mass storage device, and generating the reference spectra includes selecting and copying those model spectra from the appropriate portion of the parameter space. In some implementations, the reference spectra are calculated directly from the optical model. In this case, the model spectra can be discarded.

Once the reference spectra are generated, monitoring of a product substrate with the in-situ or in-line monitoring system the system can be performed. The controller compares the measured spectrum to the reference spectra of the second step and finds the best matching reference spectrum. For example, to find the best match, the controller can calculate a difference value between each reference spectrum and the measured spectrum and finds the best match. The difference value can be calculated using a sum of squares difference, a sum of absolute differences, or a cross-correlation between the test spectrum and the model spectrum. Optionally, the algorithm to calculate the difference value between the measured spectrum and the reference spectrum can be the same as used to calculate the difference value between the test spectrum and the model spectrum.

The fitting of an optical model to the measured spectrum can also be performed using the first step above to identify seed values to use in the fitting algorithm. That is, the model spectra are calculated, the model spectra are compared to a test spectrum to generate a difference value map, and local minima in the difference value map are identified. However, rather than generate reference spectra, the parameter values for the local minima are used as seed values in the fitting algorithm.

Once a seed value is identified, regression can be used, optionally on a finer scale than used to generate the model spectra, to fit the optical model to the measured spectrum. Examples of regression techniques include Levenberg-Marquardt (L-M)—which utilizes a combination of Gradient Descent and Gauss-Newton; Fminunc( )—a matlab function; lsqnonlin( )—matlab function that uses the L-M algorithm; and simulated annealing. In addition, non-regression techniques, such as the simplex method, can be used to optimize the parameters.

In some implementations, generation or selection of the reference spectra can be limited based on measurements of a particular substrate prior to measurement at the in-line or in-situ monitoring system. That is, the value of at least one input parameter of the optical model is measured. In some implementations, the value for the substrate is measured at a stand-alone metrology station before the substrate is measured with the in-line monitoring system. In some implementation, the value for the substrate is measured at an in-line monitoring station before the substrate is transported to a polishing station and measured with the in-situ monitoring system.

The reference spectra can be generated from the optical model as follows. For any input parameter that is measured, those input parameters are held fixed at the measured value. However, for the remaining input parameters are varied across the second volume of the parameter space as described above, e.g., each input parameter that did not have a measured value is stepped regularly across the associated range that was selected based on the position in the parameter space of the local minimum.

In some implementations, before polishing, an in-line or stand-alone metrology system measures the substrate and determines an index of refraction and an extinction coefficients of a layer on the substrate. The substrate moves to an in-line metrology station of a polishing station. The controller receives the index of refraction and extinction coefficient of the layer as known values. The controller software generates a reference spectra using the indices of refraction and extinction coefficient that are known and fixed, while incrementally varying the thickness across a range that is set by the position of the local minimum.

Figure 5:
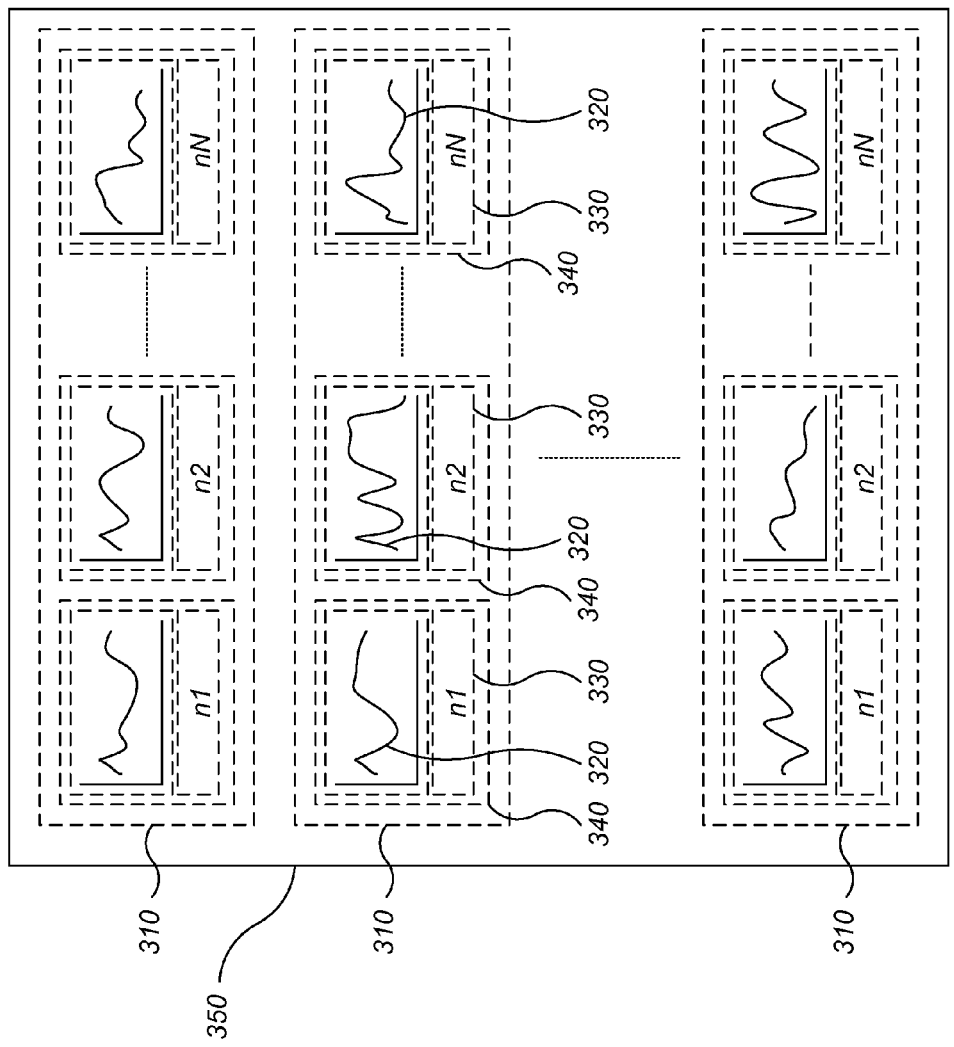
FIG. 5 illustrates a library of reference spectra.

Referring to FIGS. 4 and 5, a measured spectrum 300 (see FIG. 4) can be compared to reference spectra 320 from one or more libraries 310 (see FIG. 5).

In some implementations, each reference spectrum 320 (see FIG. 5) is assigned an value 330. This value 330 can be the thickness of outermost layer, Alternatively, this value 330 can be the value, e.g., a number, representing the time in the polishing process at which the reference spectrum 320 is expected to be observed.

The reference spectra and their associated values can be stored in a reference library. For example, each reference spectrum 320 and its associated value 330 can be stored in a record 340 of database 350. The database 350 of reference libraries of reference spectra can be implemented in memory of the computing device of the polishing apparatus. In some implementation, one or more of the reference spectra, e.g., all of the reference spectra are calculated on the fly, e.g., after a measurement at an in-line monitoring station but before polishing.

As noted above, for each zone of each substrate, based on the sequence of measured spectra or that zone and substrate, the controller 190 can be programmed to generate a sequence of best matching spectra. A best matching reference spectrum can be determined by comparing a measured spectrum to the reference spectra from a particular library.

In some implementations, the best matching reference spectrum can be determined by calculating, for each reference spectrum, a sum of squared differences between the measured spectrum and the reference spectrum. The reference spectrum with the lowest sum of squared differences has the best fit. Other techniques for finding a best matching reference spectrum are possible, e.g., lowest sum of absolute differences.

In some implementations, the best matching reference spectrum can be determined by using a matching technique other than sum of squared differences. In one implementation, for each reference spectrum, a cross-correlation between the measured spectrum and the reference spectrum is calculated, and the reference spectrum with the greatest correlation is selected as the matching reference spectrum. A potential advantage of cross-correlation is that it is less sensitive to lateral shift of a spectrum, and thus can be less sensitive to underlying thickness variation. In order to perform the cross-correlation, the leading and trailing ends of the measured spectrum can be padded with "zeros" to provide data to compare against the reference spectrum as the reference spectrum is shifted relative to the measured spectrum. Alternatively, the leading end of the measured spectrum can be padded with values equal to the value at the leading edge of the measured spectrum, and he trailing end of the measured spectrum can be padded with values equal to the value at the trailing edge of the measured spectrum. Fast Fourier transforms can be used to increase the speed of calculation of the cross-correlation for real-time application of the matching technique.

Figure 6:
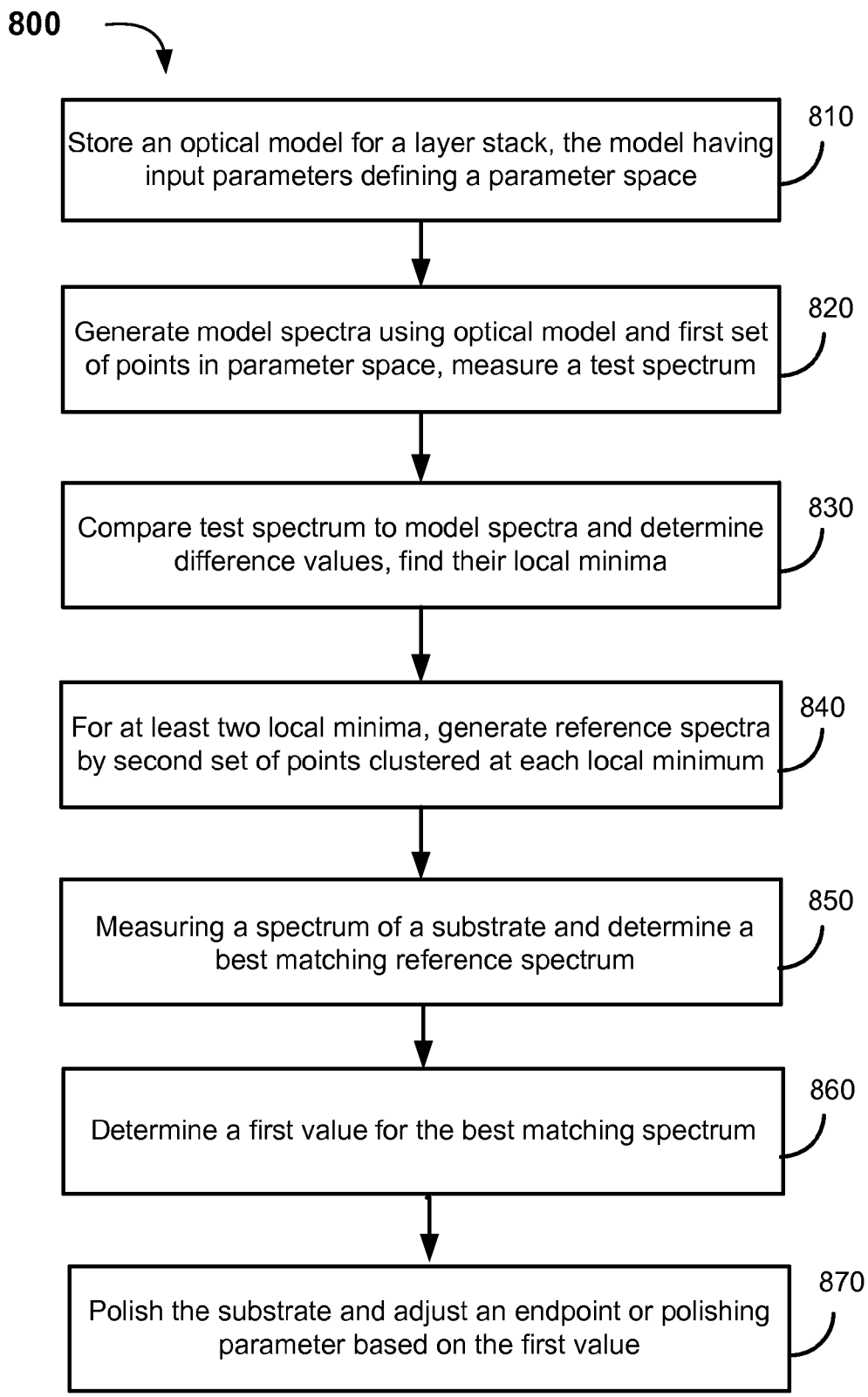
FIG. 6 is a flow graph of a method for controlling a polishing operation of a product substrate.

FIG. 6 shows a flow graph of a method 800 for controlling a polishing operation of a product substrate. The controller stores an optical model for a layer stack (step 810). The model includes a number of input parameters defining a parameter space. Examples of the input parameters include one or more of thicknesses, indices of refraction, or extinction coefficients of each of the layers in the layer stack. The controller generates a number of model spectra using the optical model and a first set of different points in the parameter space (step 820). The controller measures a test spectrum from a test substrate. The controller compares the test spectrum to the model spectra and determines a difference value for each generated model spectra and then finds the local minima of the difference values (step 830). For at least one local minimum, e.g., at two local minima, of the difference values, the controller generates a number of reference spectra using the optical model and a second set of different points in the parameter space where the second set of points are clustered around the local minima (step 840). The spectrum of a substrate is measured by an in-sequence or in-situ monitoring system, the controller determines a best matching reference spectrum from the reference spectra for the measured spectrum (step 850), and based on the matched reference spectrum the controller determines a first value (step 860). This first value is the value of the parameter of interest, e.g., thickness of the outermost layer, that was used to generate the reference spectrum. The substrate is polished by the polishing apparatus and a polishing endpoint or a polishing parameter is adjusted based on the first value (step 870).

In some implementations, for the first set of points, a first parameter changes and for the second set of points, a second parameter changes and the model spectra is calculated for each combination of the first values and the second values. Each parameter includes a range and an increment or a number of increments.

In some implementations, determining the local minima includes dividing the parameter space into a number of sections and determining a local minimum for each section. The first set of different points are distributed in the parameter space at a uniform first spacing where the multiple sections cover the parameter space at a uniform second spacing greater than the first spacing.

In some implementations, the second set of different points is uniformly distributed in the parameter space at the first spacing and the second set of different points is a subset of the first set of different points. In an example, the second set of different points is distributed in the parameter space at spacing different from the first spacing. In another example, the second set of different points is centered on a point in the parameter space corresponding to a local minimum.

In some implementations, storing data includes a third set of third values for a first parameter and a fourth set of fourth values for a second parameter of the input parameters and generating the reference spectra includes calculating the reference spectrum for each combination of a third value of third set and a fourth value of the fourth set and the data for each third or fourth set includes a range and an increment or a number of increments.

In some implementations, comparing the test spectrum to the model spectrum includes calculating a sum of squares difference, a sum of absolute differences, or a cross-correlation between the test spectrum and the model spectrum.

Figure 7:
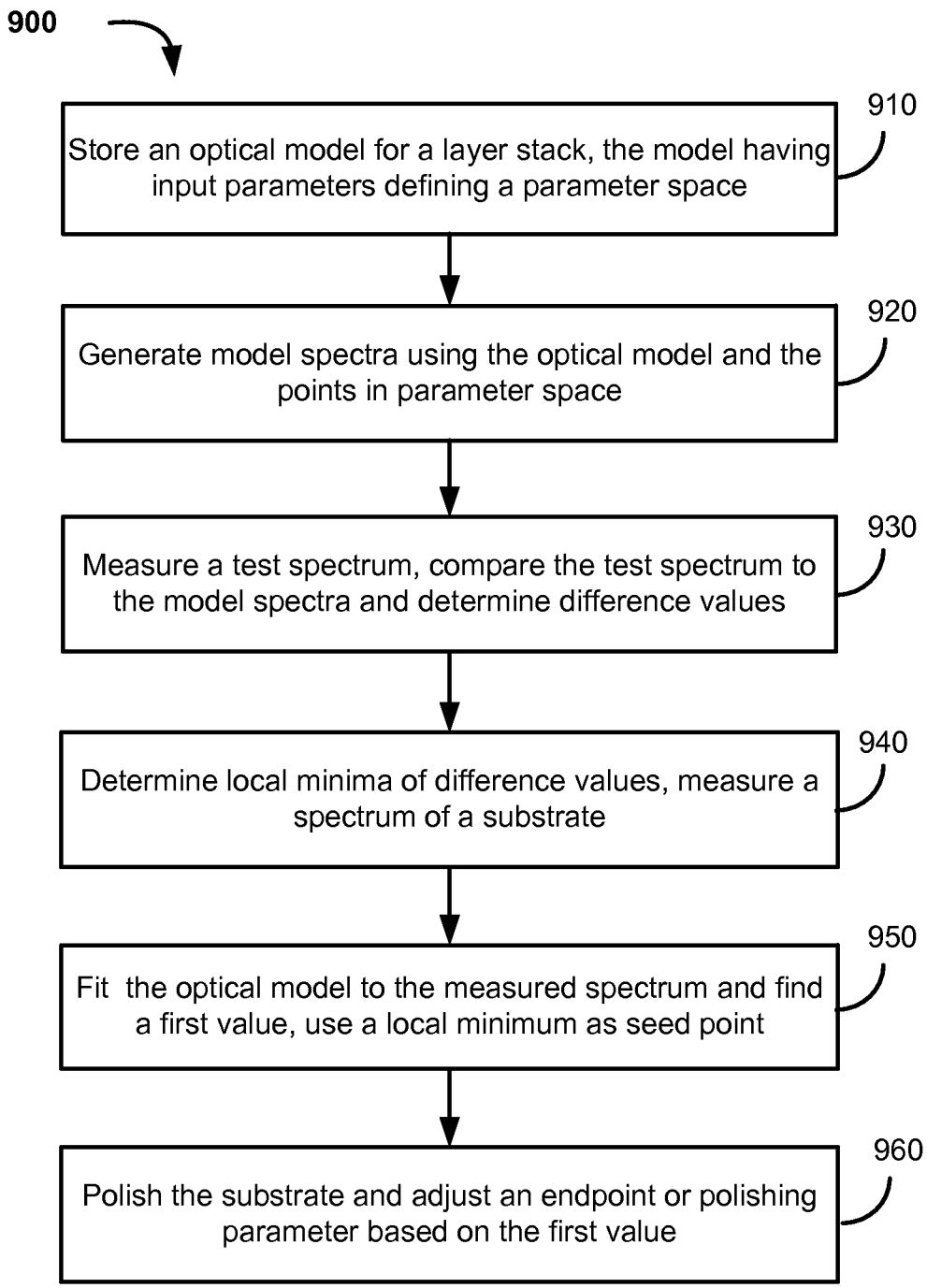
FIG. 7 is a flow graph of a method for controlling a polishing operation.

FIG. 7 shows a flow graph of a method 900 for controlling a polishing operation. The controller stores an optical model for a layer stack (step 910). The model includes a number of input parameters defining a parameter space. The parameters are one or more of thicknesses, indices of refraction, or extinction coefficients of the layer stack. The controller generates a number of model spectra using the optical model and the points in the parameter space (step 920). The controller measures a test spectrum and compares the test spectrum to the model spectra and determines difference values (step 930). Then the controller finds the local minima of the difference values and a spectrum of a substrate is measured by the in-sequence or in-situ monitoring system (step 940). An optical model is fit to the measured spectrum. (step 950). The fitting includes finding a first value of the first parameter that provides a minimum difference between an output spectrum of the optical model and the measured spectrum. The fitting also includes using a point in the parameter space corresponding to a local minimum as a seed value in searching for the minimum difference. The substrate is polished by the polishing apparatus and a polishing endpoint or a polishing parameter is adjusted (step 960) where the adjustment is based on the first value associated with the fitted optical model.

Embodiments of the invention and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in a machine readable storage media, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Particular embodiments of the invention have been described. Other embodiments are within the scope of the following claims.

What is claimed is:

1. A method of controlling a polishing operation, comprising:
    storing an optical model for a layer stack having a plurality of layers, the optical model having a plurality of input parameters, the plurality of input parameters defining a parameter space;
    generating a plurality of model spectra by calculating a model spectrum using the optical model for each of a first plurality of different points in the parameter space;
    measuring a test spectrum of a test substrate;
    for each model spectrum of the plurality of model spectra, comparing the test spectrum to the model spectrum to determine a difference value, thereby generating a plurality of difference values;
    determining a plurality of minima in the plurality of difference values;
    for at least one local minimum of the plurality of minima, determining a plurality of reference spectra, the plurality of reference spectra for each local minimum generated using the optical model with a second plurality of different points in the parameter space clustered at a point in the parameter space corresponding to the local minimum;
    measuring a spectrum of a substrate with an in-sequence or in-situ monitoring system to provide a measured spectrum;
    determining a best matching reference spectrum from the plurality of reference spectra that provides a best match to the measured spectrum;
    determining a value associated with the best matching reference spectrum;
    polishing the substrate with a polishing apparatus; and
    adjusting a polishing endpoint or a polishing parameter of the polishing apparatus based on the value associated with the best matching reference spectrum.

2. The method of claim 1, comprising storing data defining a first plurality of first values for a first parameter of the plurality of input parameters and a second plurality of second values for a second parameter of the plurality of input parameters.

3. The method of claim 2, wherein generating the plurality of model spectra includes calculating the model spectrum for each combination of a first value of first plurality of first values and a second value of the second plurality of second values.

4. The method of claim 3, wherein the data comprises, for each parameter of the plurality of parameters, a range and an increment or a number of increments.

5. The method of claim 1, wherein determining the plurality of minima comprises dividing the parameter space into a plurality of sections and determining a minimum for each section.

6. The method of claim 5, wherein the first plurality of different points are distributed in the parameter space at a uniform first spacing and the plurality of sections cover the parameter space at a uniform second spacing greater than the first spacing.

7. The method of claim 6, wherein the second plurality of different points are uniformly distributed in the parameter space at the first spacing.

8. The method of claim 7, wherein the second plurality of different points is a subset of the first plurality of different points.

9. The method of claim 6, wherein the second plurality of different points are distributed in the parameter space at spacing different from the first spacing.

10. The method of claim 1, wherein the second plurality of different points are centered around the point in the parameter space corresponding to the local minimum.

11. The method of claim 10, comprising storing data defining a third plurality of third values for a first parameter of the plurality of input parameters and a fourth plurality of fourth values for a second parameter of the plurality of input parameters.

12. The method of claim 11, wherein generating the plurality of reference spectra includes calculating the reference spectrum for each combination of a third value of third plurality and a fourth value of the fourth plurality.

13. The method of claim 12, wherein the data comprises, for each parameter of the plurality of parameters, a range and an increment.

14. The method of claim 1, wherein comparing the test spectrum to the model spectrum comprises calculating a sum of squares difference, a sum of absolute differences, or a cross-correlation between the test spectrum and the model spectrum.

15. A method of controlling a polishing operation, comprising:

storing an optical model for a layer stack having a plurality of layers, the optical model having a plurality of input parameters, the plurality of input parameters defining a parameter space;

generating a plurality of model spectra by calculating a model spectrum using the optical model for each of a first plurality of different points in the parameter space;

measuring a test spectrum of a test substrate;

for each model spectrum of the plurality of model spectra, comparing the test spectrum to the model spectrum to determine a difference value, thereby generating a plurality of difference values;

determining a plurality of minima in the plurality of difference values;

measuring a spectrum of a substrate with an in-sequence or in-situ monitoring system to provide a measured spectrum;

fitting the optical model to the measured spectrum, the fitting including finding a first value of a first parameter of the plurality of input parameters that provides a minimum difference between an output spectrum of the optical model and the measured spectrum, the fitting including using a point in the parameter space corresponding to a local minimum from the plurality of minima as a seed value in searching for the minimum difference;

polishing the substrate with a polishing apparatus;

adjusting a polishing endpoint or a polishing parameter of the polishing apparatus based on the first value.

* * * * *